United States Patent
Edwards et al.

(10) Patent No.: US 9,354,252 B2
(45) Date of Patent: May 31, 2016

(54) PRESSURE SENSING AND CONTROL FOR SEMICONDUCTOR WAFER PROBING

(71) Applicant: International Business Machines Corporation, Armonk, NY (US)

(72) Inventors: Robert D. Edwards, Marlboro, NY (US); Oleg Gluschenkov, Tannersville, NY (US); Louis V. Medina, Hopewell Junction, NY (US); Tso-Hui Ting, Stormville, NY (US); Ping-Chuan Wang, Hopewell Junction, NY (US); Yongchun Xin, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/560,138

(22) Filed: Dec. 4, 2014

(65) Prior Publication Data

US 2015/0145544 A1    May 28, 2015

Related U.S. Application Data

(62) Division of application No. 13/285,048, filed on Oct. 31, 2011, now Pat. No. 8,963,567.

(51) Int. Cl.
*G01R 1/067* (2006.01)
*G01R 31/28* (2006.01)
*G01R 1/073* (2006.01)

(52) U.S. Cl.
CPC ........ *G01R 1/06794* (2013.01); *G01R 1/07364* (2013.01); *G01R 31/2891* (2013.01)

(58) Field of Classification Search
CPC ........... G01R 1/06711; G01R 1/06738; G01R 1/07314; G01R 31/2891; G01L 1/18; G01L 23/00; G01L 9/08; H01L 29/84
See application file for complete search history.

(56) References Cited

U.S. PATENT DOCUMENTS

| | | | |
|---|---|---|---|
| 4,219,771 A | | 8/1980 | Reid et al. |
| 4,328,553 A | * | 5/1982 | Fredriksen ............ H01L 21/681 125/13.01 |
| 4,758,785 A | | 7/1988 | Rath |
| 5,894,161 A | * | 4/1999 | Akram ............... G01R 1/06711 257/417 |
| 6,469,537 B1 | | 10/2002 | Akram et al. |
| 6,720,789 B1 | | 4/2004 | Audette et al. |
| 6,784,678 B2 | * | 8/2004 | Pietzschmann .... G01R 1/07378 324/750.22 |
| 6,853,208 B2 | | 2/2005 | Okubo et al. |

(Continued)

OTHER PUBLICATIONS

PhysikInstrumente [online]; [retrieved on Oct. 24, 2011]; retrieved from the Internethttp://www.physikinstrumente.com/en/products/piezo_tutorial.phpPI: Piezo Motion Control, Designing with Piezoelectric Actuators, Piezo Nanopositioning Tutorial / Piezoelectrics in Positioning; pp. 1-3; 1996.

*Primary Examiner* — Vinh Nguyen
(74) *Attorney, Agent, or Firm* — Cantor Colburn LLP; Steven Meyers

(57) ABSTRACT

A wafer probing system includes a probe card assembly having a plurality of individual probe structures configured make contact with a semiconductor wafer mounted on a motor driven wafer chuck, with each probe structure configured with a pressure sensing unit integrated therewith; and a controller configured to drive the probe card assembly with one or more piezoelectric driver units response to feedback from the pressure sensing units of the individual probe structures.

20 Claims, 9 Drawing Sheets

(56) References Cited

U.S. PATENT DOCUMENTS

| | | |
|---|---|---|
| 7,262,617 B2 | 8/2007 | Komatsu et al. |
| 7,368,929 B2 | 5/2008 | Nayak et al. |
| 7,688,096 B2 | 3/2010 | Inomata |
| 7,847,569 B2 | 12/2010 | Yonezawa et al. |
| 7,902,850 B2 | 3/2011 | Fredericksen et al. |
| 2009/0212805 A1 | 8/2009 | Chen et al. |

* cited by examiner

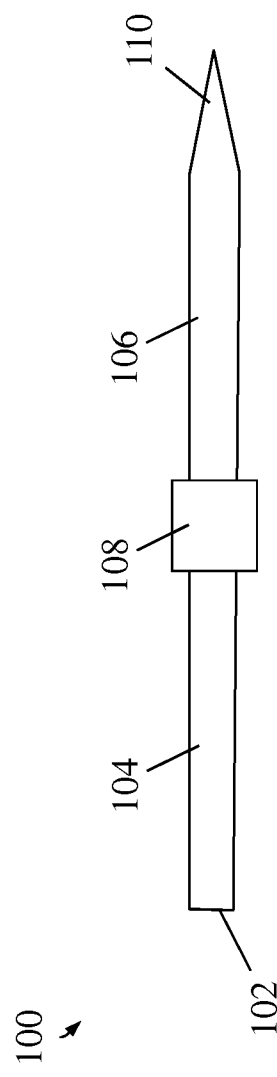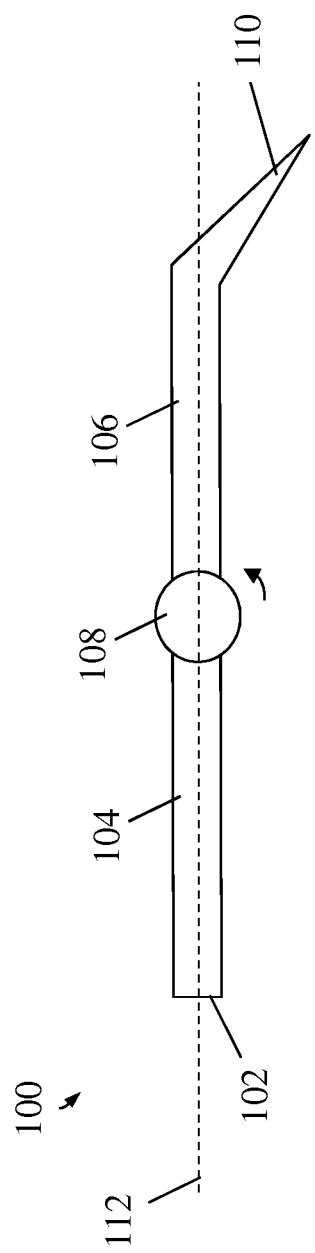
Figure 1(a)
Figure 1(b)

PRESSURE SENSING AND CONTROL FOR SEMICONDUCTOR WAFER PROBING

DOMESTIC PRIORITY

This application is a division of U.S. patent application Ser. No. 13/285,048, filed Oct. 31, 2011, now U.S. Pat. No. 8,963,567 the disclosure of which is incorporated by reference herein in its entirety.

BACKGROUND

The present invention relates generally to semiconductor device manufacturing and, more particularly, to an apparatus and method for improved pressure sensing control during wafer probing of integrated circuits.

Integrated circuits are often manufactured on a semiconductor substrate, such as a silicon wafer. Typically, a single wafer will have numerous integrated circuit (IC) devices formed thereon a lattice pattern. Each IC device has of numerous layers of circuitry and a collection of external bonding pads, which are small sites made from a conductive material such as aluminum. The bonding pads eventually serve as the device's connections to the pin leads.

Since the packaging of a device is a costly procedure, it is desirable to test a device beforehand to avoid packaging faulty devices. The testing process involves initially establishing electrical contact between a probe card and the wafer, and thereafter running a series of tests on the devices on the wafer's surface. The probe card has a collection of individual electrical contact pins or probes that stand in for the normal pins and wire leads of a packaged device. The wafer is positioned relative to the probe card so that the contact pins on the probe card make contact with a wafer's bonding pads and probe pads while a special tester runs a series of electrical tests on the wafer's devices. A wafer prober is used to position the wafer with respect to the probe card.

In order to provide appropriately reliable electrical contact with a device under test (DUT), numerous and diverse types of probes have been developed in the technology, wherein it is normally recognized that each probe type necessitates the employment of a specific probing force. An insufficient contact force between the probe and the wafer will result in an unreliable electrical contact, while an excessive contact force will result in damage to the probes or contact pads on the DUT. Currently, most systems which are employed for wafer testing do not incorporate sufficiently reliable structure or testing steps which will readily or accurately determine the probe force that is being applied to each pad on the DUT during implementation of the testing procedure.

Each probe technology has a characteristic probe compliance or spring rate, and thus the correct probe force occurs at a specific probe displacement. Consequently, a current wafer testing practice is to overdrive or displace the wafer the specified distance into the probe system. Unfortunately, the resulting forces may result in significant deflection of the probe support structure. This is especially a problem with probe arrays that incorporate a large number of probes. In this case, the amount of overdrive must be increased to overcome deflection of the support structure. The actual amount of the resultant force is not readily determinable and may be open to conjecture. Thus, a typical overdrive is ordinarily determined experimentally for one particular product, and through extrapolation or assumptions employed for all similar systems and products.

SUMMARY

In an exemplary embodiment, a wafer probing system includes a probe card assembly having a plurality of individual probe structures configured make contact with a semiconductor wafer mounted on a motor driven wafer chuck, with each probe structure configured with a pressure sensing unit integrated therewith; and a controller configured to drive the probe card assembly with one or more piezoelectric driver units response to feedback from the pressure sensing units of the individual probe structures.

In another embodiment, a method of implementing a wafer probing system includes positioning a semiconductor wafer mounted on a motor driven wafer chuck to a preset position to initiate contact between the wafer and a probe card assembly having a plurality of individual probe structures, with each probe structure configured with a pressure sensing unit integrated therewith; and upon detection of contact between at least one probe structure and a surface of the wafer via a pressure sensing unit of the at least one probe structure, engaging a plurality of piezoelectric driver units in response to feedback from the pressure sensing unit so as to perform fine adjustment of the at least one probe structure and ensure contact between the at least one probe structure and a surface of the wafer.

In another embodiment, a probe card assembly for wafer probing system, includes a supporting stage having a plurality of individual probe structures attached thereto, each probe structure configured with a pressure sensing unit integrated therewith so as to detect contact between the probe structure and a surface of a wafer; wherein the probe structure further comprises a flexible probe arm having a first segment and a second segment pivotally joined to one another by a connection mechanism, and a probe tip disposed at a distal end of the second segment, such that contact between the probe tip and the wafer surface allows the second segment to pivot about the connection mechanism and deflect away from a longitudinal axis of the probe structure.

BRIEF DESCRIPTION OF THE DRAWINGS

Referring to the exemplary drawings wherein like elements are numbered alike in the several Figures:

FIG. 1(a) is a top view of a probe structure suitable for use in accordance with an exemplary embodiment of the disclosure;

FIG. 1(b) is a side view of the probe structure of FIG. 1(a);

DETAILED DESCRIPTION

Figure 2:
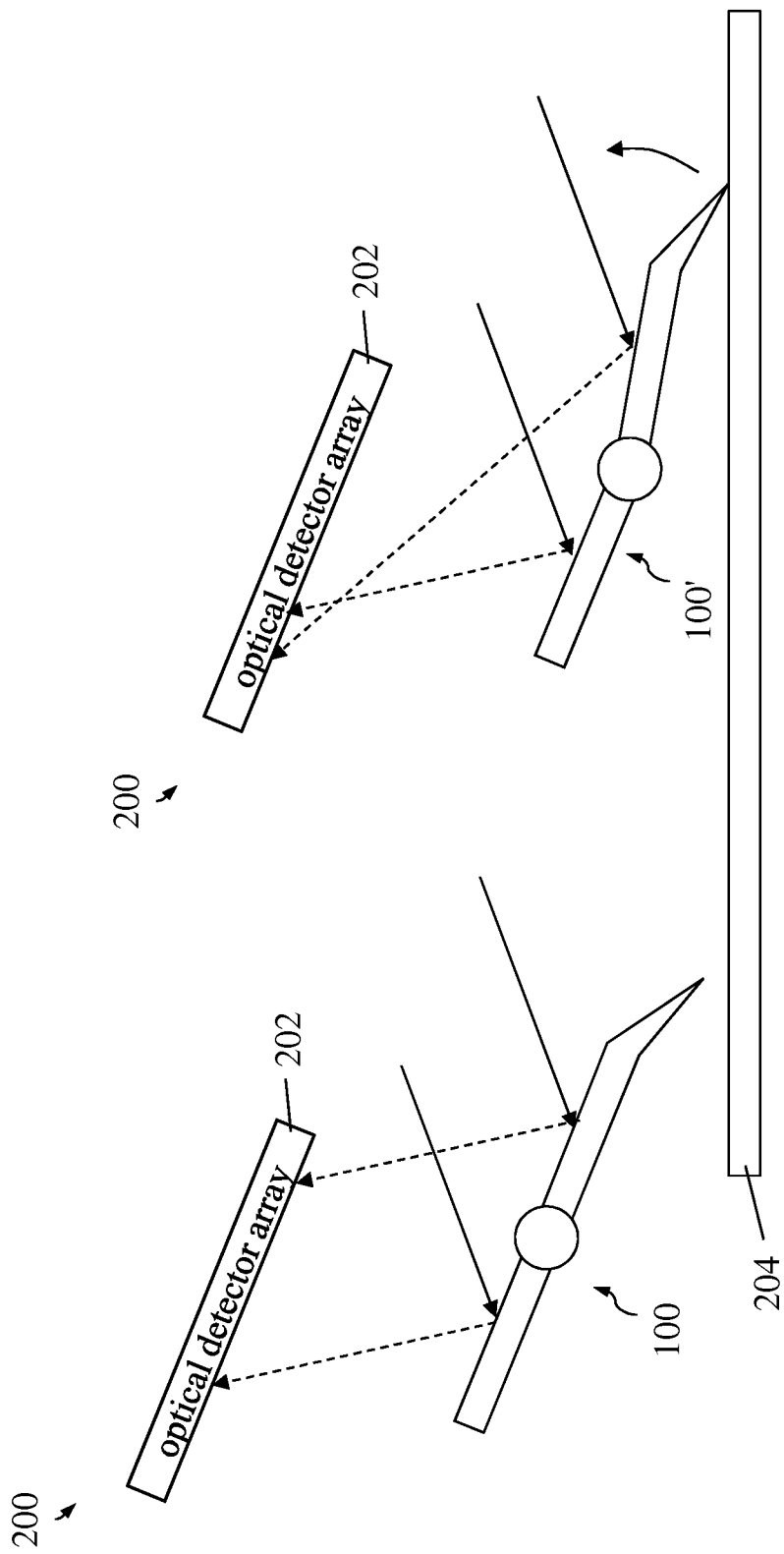
FIG. 2 illustrates a probe structure having an integrated pressure sensing unit using an optical detection technique, in accordance with an exemplary embodiment of the disclosure.

It has been recently observed that inline test probing causes mechanical damage to material layers (particularly copper and enclosed low-k dielectric layers) on semiconductor chips. Such damage results in significant yield loss and reliability degradation. Historically, cantilever probe cards used in manufacturing have applied downward forces in the neighborhood of about 4 grams (g) at a rated overdrive compliance (typically 2 mils). This 4 g of force has also proved robust in maintaining stable contact resistance at acceptable levels. However, with the introduction of ultra low-k (ULK) dielectrics, excessive downward pressure may cause pad damage, as well as underlying structure damage.

A common solution to this problem is to use probe cards built with a low down force (LDF) specification. This may be accomplished by the probe supplier modifying the physical dimensions of the probe needle to obtain a lower balance contact force (BCF). A typical example would be to order a card with 1 gram per mil BCF rating (versus a 2 grams per mil BCF, for example). However, a disadvantage of reducing the BCF would be an increase in contact resistance due to the fact that less force is available to break thru any oxide coating on the Al/Cu pads.

Traditionally, spring-loaded probes are adapted to protect copper pad and ultra low-k (ULK) dielectric materials from probing induced damage, as well as to make sure each probe makes good contact to the respective probing pad. In such a case, probe pressure from probe tip overdrive may be reduced by a spring-loaded probe tip and probe cards built with a low down force (LDF) specification. However, a conventional probe system is unable to determine whether or not each probe is making contact with a pad, and thus mechanical damage by probe contact and overdrive may still occur.

Accordingly, disclosed herein are embodiments of an apparatus, system and method of improved pressure sensing control during wafer probing of integrated circuits. In one aspect, a novel probe structure incorporates a pressure sensing unit with each individual probe or pin, which units in turn enable a feedback control system to ensure that each probe makes contact with a corresponding landing pad. As described in further detail below, the feedback control system is configured to implement a fine adjustment of probes, either locally (regionally) or individually through the use of a piezoelectric driver unit.

Referring initially to FIGS. 1(a) and 1(b), there is shown top and side views, respectively, of a probe structure 100 suitable for use in accordance with an exemplary embodiment of the disclosure. The probe structure 100 includes a flexible probe arm 102 having a first segment 104 and a second segment 106 pivotally joined to one another by a connection mechanism such as a torsion spring 108 for example. Disposed at a distal end of the second segment 106 probe arm 102 is a probe tip 110 configured to be brought in engagement with a semiconductor wafer (not shown in FIGS. 1(a) and 1(b)). As described in further detail below, a proximal end of the first segment 104 is secured to a probe card (not shown in FIGS. 1(a) and 1(b)), such that contact between the probe tip 110 and a wafer surface allows the second segment 106 to pivot about the torsion spring 108 and deflect away from a longitudinal axis 112 of the probe structure 100.

Figure 3:
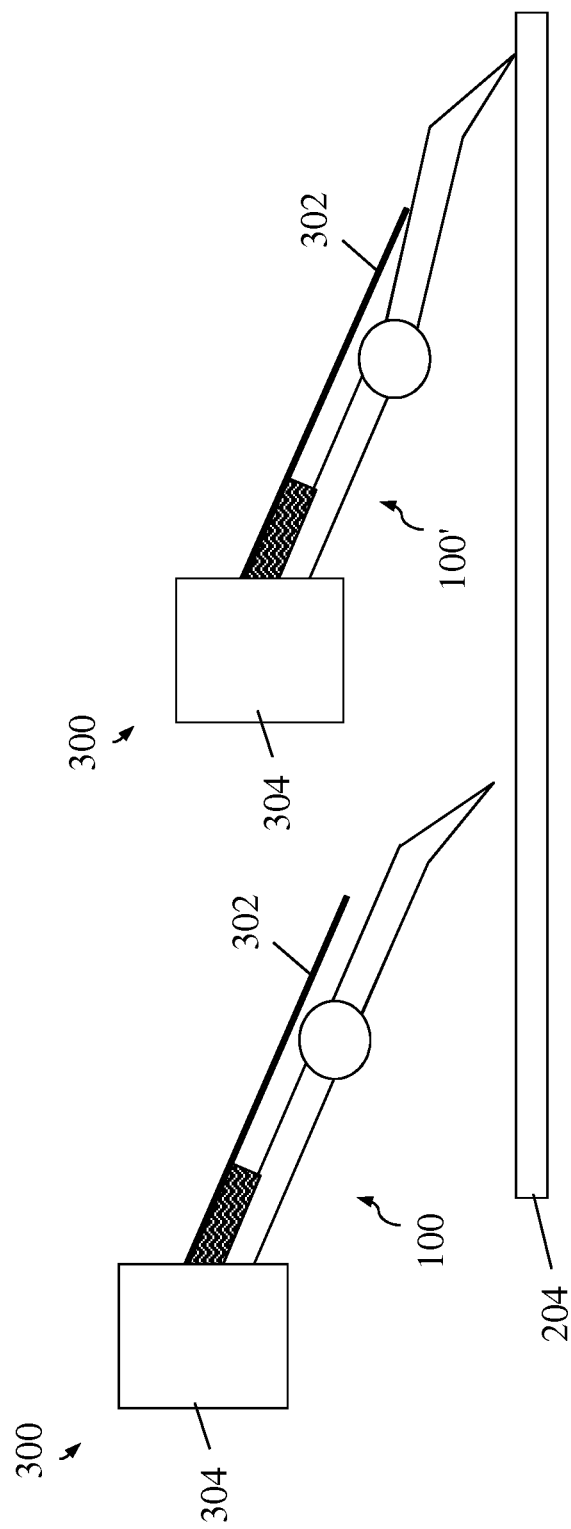
FIG. 3 illustrates a probe structure having an integrated pressure sensing unit using an electrical detection technique, in accordance with an exemplary embodiment of the disclosure.
Figure 4:
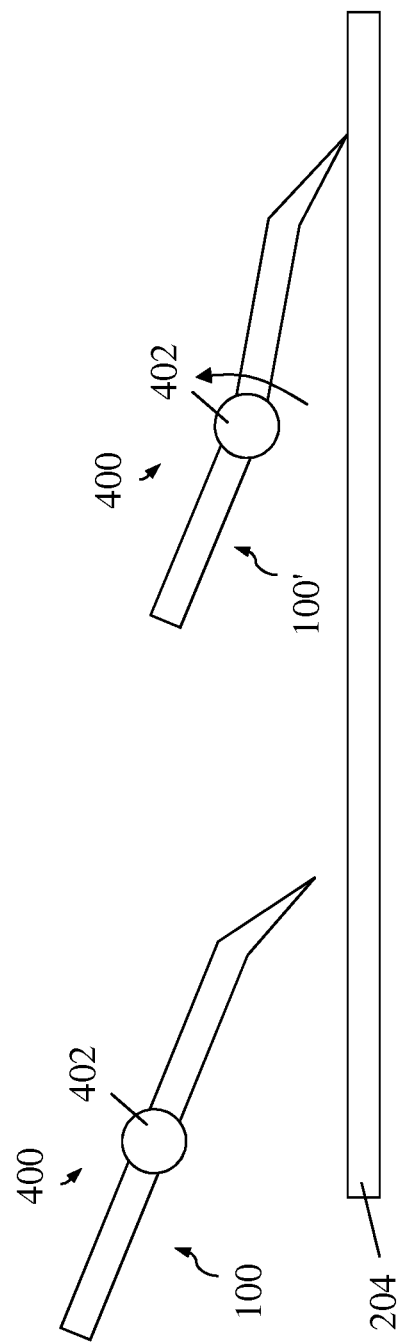
FIG. 4 illustrates a probe structure having an integrated pressure sensing unit using a mechanical detection technique, in accordance with an exemplary embodiment of the disclosure.

The degree to which the second segment 106 pivots or deflects about the torsion spring 108, and therefore the amount of pressure applied by the probe structure 100 to a semiconductor wafer may be determine by the use of an integrated pressure sensing unit provided with each individual probe structure. In this regard, several possible embodiments are contemplated, as illustrated in FIGS. 2-4. For example, FIG. 2 illustrates a probe structure 100 having an integrated pressure sensing unit 200 that uses an optical detection technique, in accordance with an exemplary embodiment of the disclosure. As illustrated, the integrated pressure sensing unit 200 includes an optical detector array 202 in proximity with the probe structure 100. The optical detector array 202 receives an optical signal (dashed arrows) incident thereupon, a result of an incident optical beam (solid arrows) directed upon the surface of the probe structure 100. The optical beam may originate from, for example, a suitable optical source such as a laser (not shown).

Where the probe structure 100 is not yet in contact with the surface of a wafer 204, or where the contact is light enough such that the probe structure is not bent or deflected, the optical detector array 202 will detect a first type of optical signature associated with an unbent probe structure. On the other hand, as the probe structure 100' is brought into contact with the surface of the wafer 204 with sufficient force so as to deflect the probe structure 100' about its pivot point, the characteristics of received optical signal (dashed arrows) changes. The degree to which this signal changes is reflective of the applied pressure to the probe structure 100' and wafer 204.

In an alternative embodiment, FIG. 3 illustrates a probe structure 100 having an integrated pressure sensing unit 300 that uses an electrical detection technique. Here, the integrated pressure sensing unit 300 includes a cantilevered electrode arm 302 in proximity with the probe structure 100. Both the electrode arm 302 and the probe structure 100 are in electrical contact with detector circuit 304, which may be for example part of a probe card assembly or a separate component. Based on the deflection of the probe structure 100, the detector circuit may measure or detect a change in one or electrical circuit parameters such as a short circuit condition, an open circuit condition, a change in capacitance, etc.

In the specific example of FIG. 3, the electrode arm 302 is disposed substantially in parallel with the longitudinal axis of the probe structure 100. As the probe structure 100' is brought in contact with the wafer 204 and begins to deflect, the distance between the end of the electrode arm 302 and the probe structure 100' decreases, possibly to the degree that the electrode arm 302 and the probe structure 100' come into contact with one another. This deflection condition may be detected by the circuit such as by determining a short circuit between the electrode arm 302 and the probe structure 100', or perhaps a change in capacitance therebetween. Alternatively, it is contemplated that the electrode arm 302 could be disposed to be in contact with the probe structure 100 when not deflected, such that deflection of the probe structure results in separation between the electrode arm 302 and the probe structure 100', thereby creating an open circuit.

In still an alternative embodiment, FIG. 4 illustrates a probe structure 100 having an integrated pressure sensing unit 400 that uses a mechanical detection technique. In this example, deflection detection may be implemented through the use of a strain gauge 402 that senses torsion. As will thus be appreciated, an integrated pressure sensing unit for a probe structure may be implemented in a variety of ways such that each probe in a probe card assembly has its own pressure sensing unit. In this manner, the information detected from each pressure sensing unit may be used for a fine adjustment of the probes.

Figure 5:
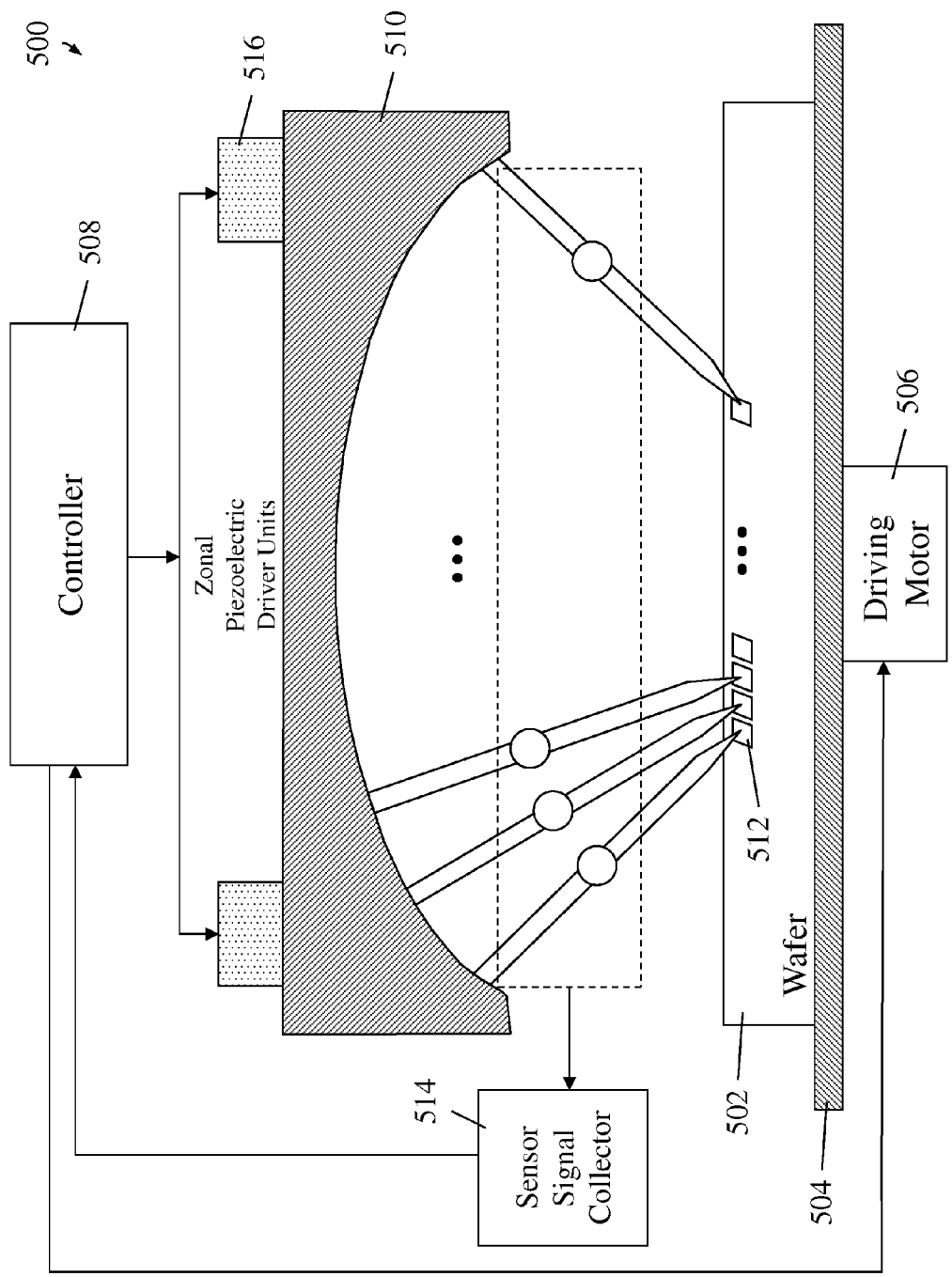
FIG. 5 is a schematic diagram illustrating a system for improved pressure sensing control during wafer probing of integrated circuits in accordance with an exemplary embodiment of the disclosure, in which zonal piezoelectric driver units are used for fine adjustment of probes.

Referring now to FIG. 5, there is shown a schematic diagram illustrating a system 500 for improved pressure sensing control during wafer probing of integrated circuits in accordance with an exemplary embodiment of the disclosure, in which zonal piezoelectric driver units are used for fine adjustment of probes. As is shown in FIG. 5, a semiconductor wafer 502 is positioned on a wafer chuck 504, the height of which may be adjusted through the use of a driving motor 506 that is controlled by a system controller 508. A probe card assembly 510 (supporting stage) has a number of individual probe structures 100 associated therewith, such as those embodiments described above, for example. The probe card assembly may include any number of individual probe structures (e.g., 25, 50) configured for engagement with corresponding conductive pads 512 formed on the wafer 502. It should be appreciated at this point that the system 500 is suitable for use with either a cantilever probe design or a vertical probe design.

For purposes of simplicity, the probe structures 100 are not depicted with any of the specific integrated pressure sensing unit embodiments described above, but is should be understood that at least one type of such units are provided therewith. Collectively, the signals derived from the individual pressure sensing units are depicted by the dashed region in FIG. 5, with the signals being received by a sensor signal collector 514 in communication with the controller 508. With the probe contact information obtained from the pressure sensing units communicated to the controller 508 by the sensor signal collector 514, the controller 508 may initiate fine adjustment of probe pressure on the wafer 502 through one or more individually controllable zonal piezoelectric driver units disposed in contact with the probe card assembly 510.

In an exemplary embodiment, the piezoelectric driver units 516 may include one or more piezoelectric actuators that are capable of dynamic and precise motion, even at nanometer scale dimensions. As shown more particularly in the top view of FIG. 6, a single piezoelectric driver unit 516 may control movement of a zone or region of the probe card assembly 510. Here, four (4) exemplary zones are depicted, meaning that individualized actuation of a given one of the piezoelectric driver units 516 will cause downward movement (i.e., precision height adjustment) of the probe(s) most closely disposed in that zone. It should be appreciated that a greater or lesser number and locations of the zones may be employed.

Figure 6:
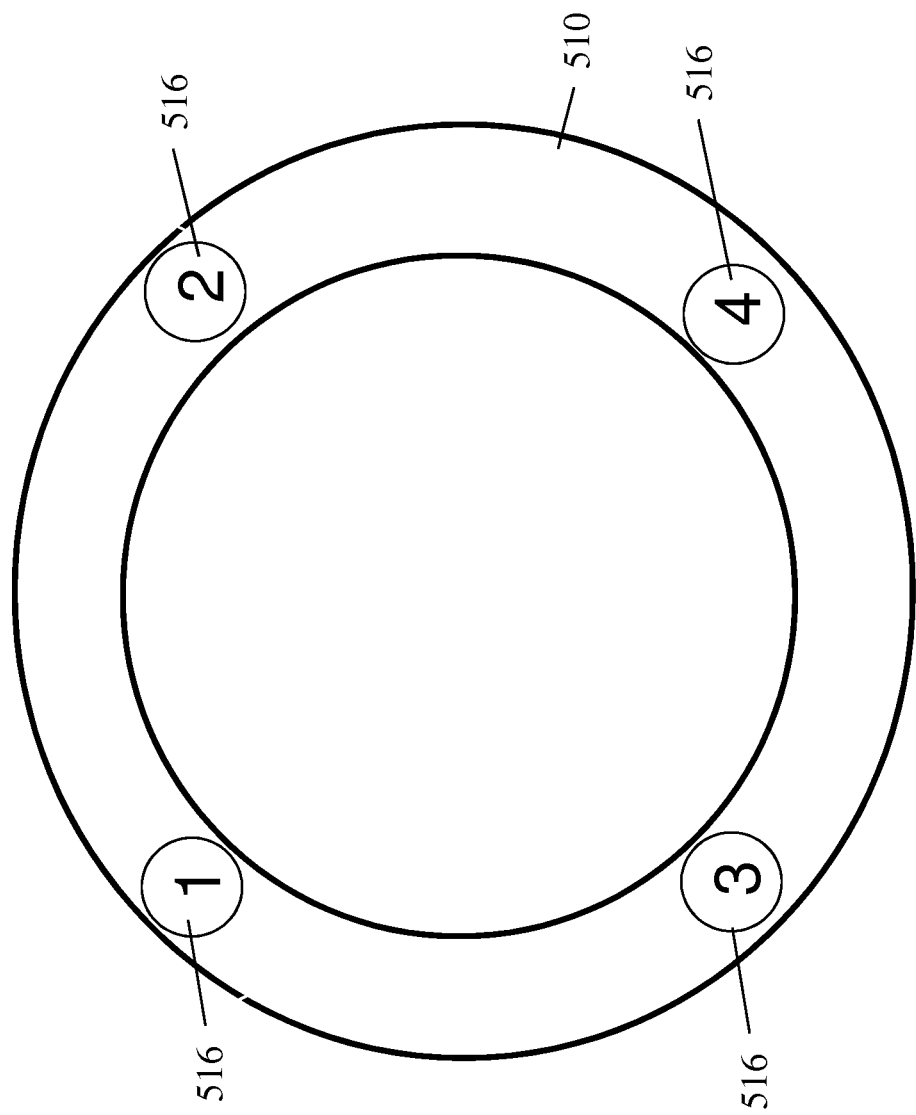
FIG. 6 is a top view of the probe card assembly of FIG. 5, illustrating the individual zonal piezoelectric driver units.
Figure 7:
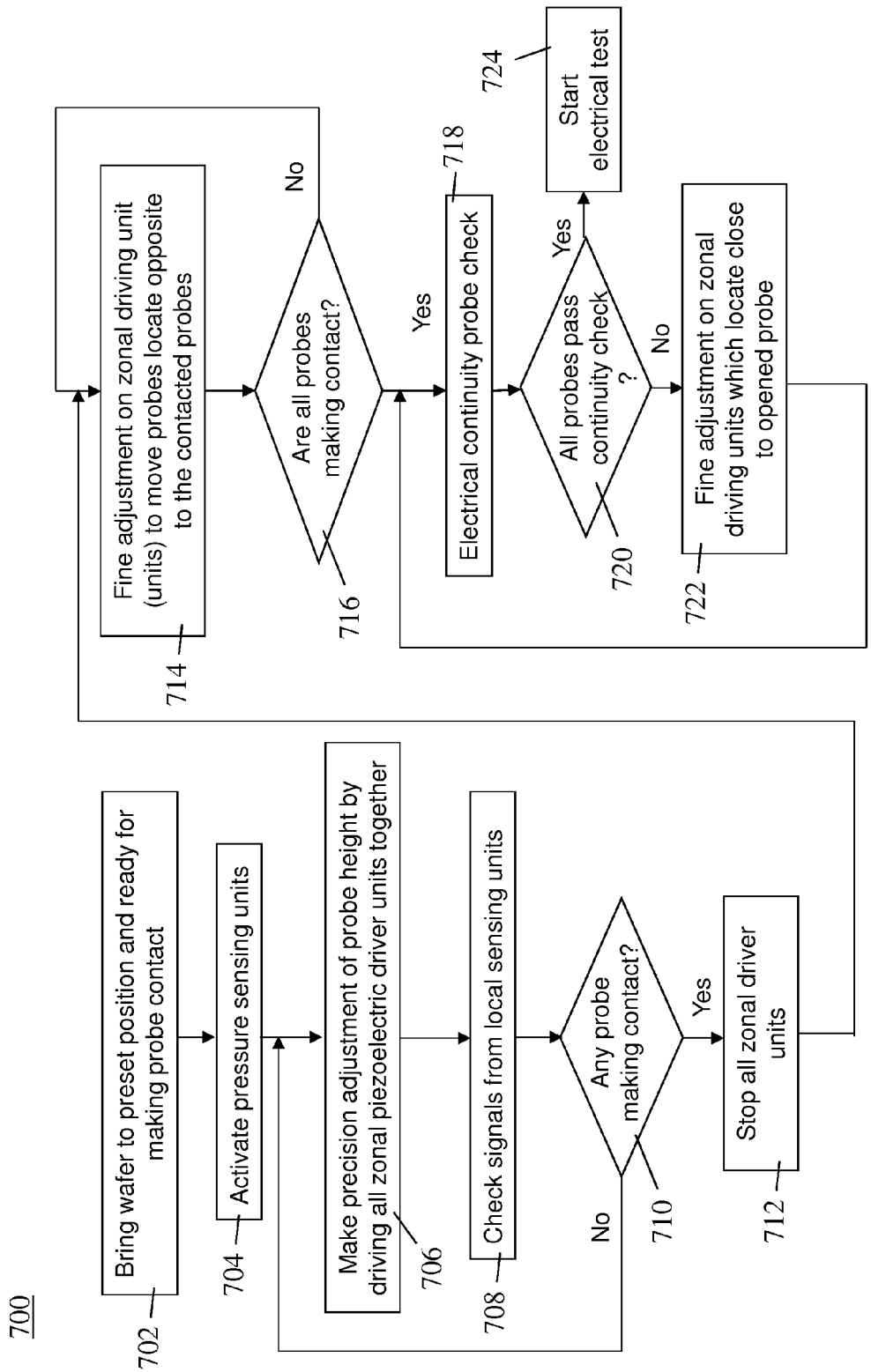
FIG. 7 is a flow diagram illustrating an exemplary method of implementing pressure sensing control during wafer probing using the system of FIGS. 5 and 6.

Referring now to FIG. 7, there is shown a flow diagram illustrating an exemplary method 700 of implementing pressure sensing control during wafer probing using the system of FIGS. 5 and 6. As illustrated in block 702, the wafer is initially brought to a preset position and readied for probe contact thereto. The pressure sensing units associated with each probe structure of the probe card assembly are activated, as shown in block 704. Then, in block 706, the probe height is precisely adjusted by activation of each of the zonal piezoelectric driver units. This results in the probe card assembly being actuated in the direction of the wafer.

As the probe card assembly and associated probe structures approach the surface of the wafer, signals from each of the integrated pressure sensing units are monitored to determine whether any of the probes have made physical contact with the wafer surface, as indicated in block 708. In accordance with decision block 710, so long as none of the probes have made contact with the wafer, the method loops back to block 706 for continued adjustment of probe height via each of the piezoelectric driver units. As soon as at least one probe is determined to have contacted the wafer surface in decision block 710, then the piezoelectric driver units are stopped as indicated in block 712.

At this point, the method transitions into a fine adjustment mode at block 714. By way of example, if it detected that a single probe structure associated with piezoelectric driver unit number 4 (FIG. 6), then fine adjustment may involve actuating only the piezoelectric driver unit number 1, which is opposite in location to piezoelectric driver unit number 4. This precise, staged mode of fine adjustment is designed to allow further downward movement of a part of the probe card assembly, but without uniformly increasing the pressure on a probe or probes that may already be in contact with the wafer. In this manner, all probes may eventually be brought into contact with the wafer.

Thus, as reflected in decision block 716, so long as all probes have not yet made contact with the wafer, the method 700 will loop back to block 714 for continued fine adjustment of the individual zonal piezoelectric driver units, focusing on zonal units whose probes have not yet made contact with the wafer. Then, once all probes have been determined to be in contact with the wafer, the method proceeds to block 718 to begin checking for proper electrical continuity between each probe and an associated pad on the wafer. Although a probe may be in physical contact with the wafer, it is still left to determine whether such contact is properly located or whether the contact is at a sufficient pressure so as to provide desired electrical continuity. Accordingly, if all probes have not passed a continuity check, then the method 700 proceeds to block for further fine adjustment of individual zonal piezoelectric driver units corresponding to the probes with insufficient continuity. The continuity check is repeated until it is determined at decision block 720 that all probes have passed. Once all probes have passed the continuity check, the method 700 may proceed to block 724 to begin electrical testing of the wafer as known in the art.

Figure 8:
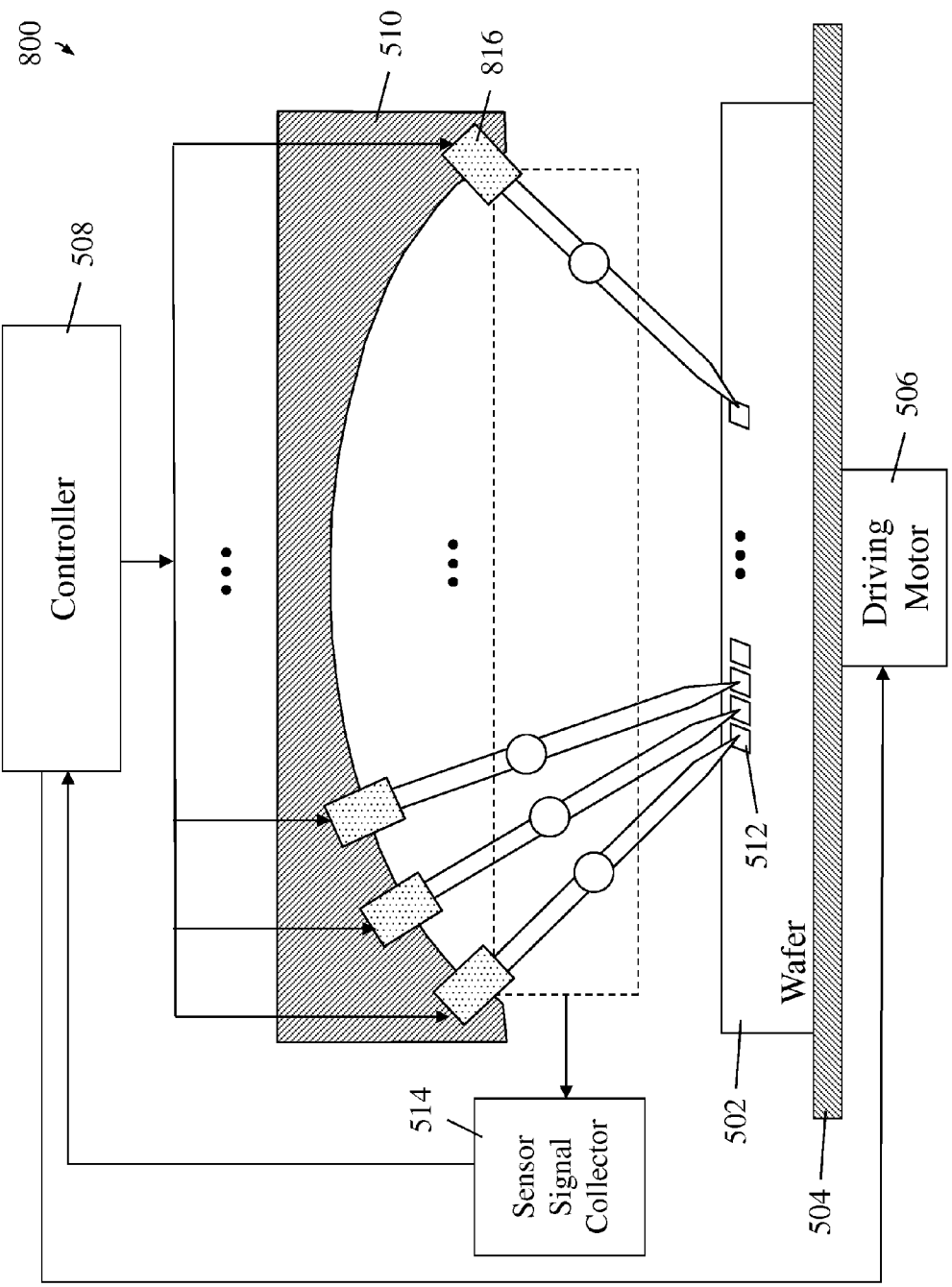
FIG. 8 is schematic diagram illustrating a system for improved pressure sensing control during wafer probing of integrated circuits in accordance with another exemplary embodiment of the disclosure, in which individual (local) piezoelectric driver units are used for fine adjustment of probes.

As an alternative to zonal piezoelectric driver units, the granularity of the fine adjustment can be further increased by providing a dedicated piezoelectric driver unit for each probe structure of the probe card assembly. Such an embodiment is depicted in FIG. 8, which illustrates a system 800 for improved pressure sensing control during wafer probing of integrated circuits in accordance with another exemplary embodiment of the disclosure. As compared with the system 500 of FIG. 5, in the system 800 of FIG. 8, the zonal piezoelectric driver units are replaced with individual (i.e., local) piezoelectric driver units 816 for each probe structure. In this manner, each probe structure may be driven individually for precise adjustment.

Figure 9:
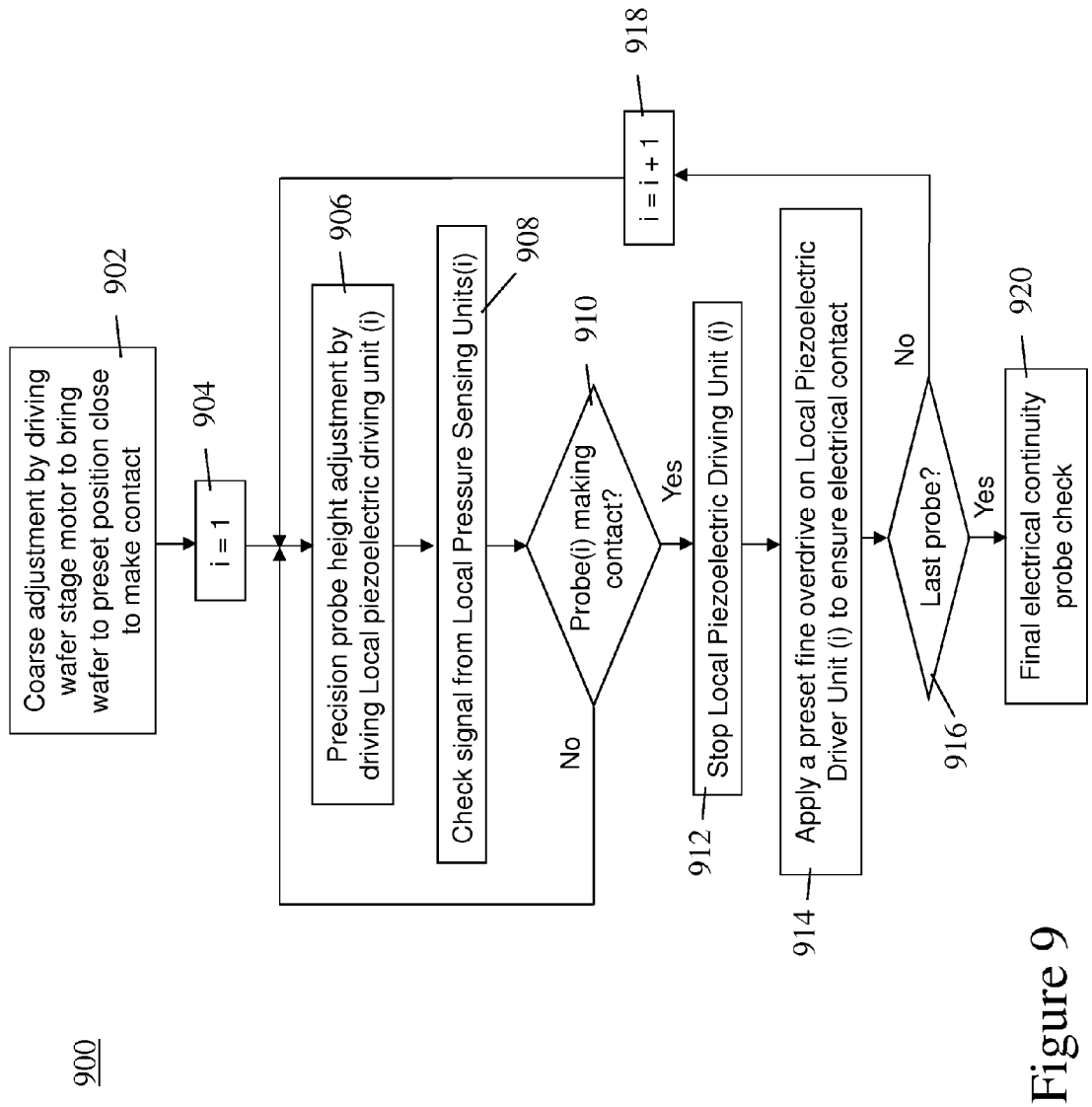
FIG. 9 is a flow diagram illustrating an exemplary method of implementing pressure sensing control during wafer probing using the system of FIG. 8.

With respect to precise adjustment, FIG. 9 is a flow diagram illustrating an exemplary method 900 of implementing pressure sensing control during wafer probing using the system of FIG. 8. In block 902, a coarse adjustment is performed by driving the wafer stage motor so as to bring the wafer into a present position such that the probes structures of the probe card assembly are in substantially close proximity to the surface of the wafer. At block 904, a probe counter is set for the first of the plurality of probe structures so that the first probe may be subjected to precision height adjustment. The first probe structure is adjusted in this regard by actuating the local, dedicated piezoelectric driver unit for that probe structure. As described above, the first probe structure (as does each probe structure) has a local pressure sensing unit also associated therewith. Thus, as the first probe is being driven by its piezoelectric driver unit, the method 900 checks the signal from the local pressure sensing unit.

If at decision block 910 it is determined that the first probe structure has not yet made contact with the wafer surface, the piezoelectric driver unit will continue its fine adjustment of the probe height until wafer contact is made. At this point, the method 900 proceeds to block 912, where the first piezoelectric driver unit is stopped, in terms of its task of providing precision height adjustment. From this point, the first piezoelectric driver unit may now be used to apply a preset level of fine overdrive adjustment to ensure proper electrical contact of the first probe structure to the wafer, as indicated in block 914. Decision block 916 determines whether the fine adjustment has been applied to the last probe, and if not, the probe counter is incremented at block 918 and the process loops back to block 906 for precision probe height adjustment of the next probe structure. Finally, once the above described operations have been completed for the last probe structure, the method 900 may proceed to block 920 for final a continuity check of the probe structures before proceeding to electrical testing of the wafer.

As will thus be appreciated, among advantages of the disclosed device, system and method embodiments include an ability to prevent probe overdriving, which can induce scratches or debris on the wafer surface. Overdriving can also damage dielectric layers, which in turn can lead to direct shorting between adjacent metal pads, and/or moisture ingress through poorly capped/sealed dielectrics that causes via opens in neighboring structures due to incomplete via etching.

In view of the above, the present embodiments may therefore take the form of computer or controller implemented processes and apparatuses for practicing those processes. The disclosure can also be embodied in the form of computer program code containing instructions embodied in tangible media, such as floppy diskettes, CD-ROMs, hard drives, or any other computer-readable storage medium, wherein, when the computer program code is loaded into and executed by a computer or controller, the computer becomes an apparatus for practicing the invention. The disclosure may also be embodied in the form of computer program code or signal, for example, whether stored in a storage medium, loaded into and/or executed by a computer or controller, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits. A technical effect of the executable instructions is to implement the exemplary methods described above and illustrated in FIGS. 7 and 9.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A method of implementing a wafer probing system, the method comprising:
    positioning a semiconductor wafer mounted on a motor driven wafer chuck to a preset position to initiate contact between the wafer and a probe card assembly having a plurality of individual probe structures, with each probe structure configured with a pressure sensing unit integrated therewith, the probe card assembly including a plurality of zones spaced apart from one another, each zone including at least one respective probe structure configured to be individually actuated with respect to other probe structures included in other zones included in the plurality of zones so as to control movement of at least one zone with respect to at least one other zone among the plurality of zones; and
    upon detection of contact between at least one probe structure and a surface of the wafer via a pressure sensing unit of the at least one probe structure, engaging a plurality of piezoelectric driver units, driving at least one probe structure of a first zone of the probe card assembly independently with respect to at least one probe structure of a second zone of the probe card assembly in response to feedback from the pressure sensing unit, and driving the at least one probe structure of a respective zone based on contact between a surface of wafer and the at least one probe structure of a respective zone so as to perform fine adjustment of the at least one probe structure and ensure contact between the at least one probe structure and a surface of the wafer.

2. The method of claim 1, further comprising:
    following positioning the semiconductor wafer to the preset position, driving the probe card assembly with each of the plurality of piezoelectric driver units until at least one of the probe structures is determined to have made contact with the surface of the wafer, wherein the plurality of piezoelectric driver units comprise zonal piezoelectric driver units, with each zonal piezoelectric driver unit configured to control movement of a zone of the probe card assembly such that individualized actuation of a given one of the piezoelectric driver units will cause precision height adjustment of probe structures associated with the zone; and
    performing a fine adjustment by driving specific zonal piezoelectric driver units associated with probe structures that have not contacted the wafer, and continuing the fine adjustment until all probe structures are determined to have contacted the wafer.

3. The method of claim 2, further comprising performing additional fine adjustment of the probe card assembly with the zonal piezoelectric driver units until each probe structure is determined to be in electrical contact with the wafer surface.

4. The method of claim 1, further comprising:
    following positioning the semiconductor wafer to the preset position, performing precision height adjustment for a first of the plurality of probe structures by driving it with a first of the piezoelectric driver units until the first probe structure is determined to have made contact with the wafer surface, wherein each of the plurality of probe structures has a dedicated piezoelectric driver unit associated therewith; and
    performing a fine adjustment of the first probe structure by further driving it with the first piezoelectric driver units until the first probe structure is determined to be in electrical contact with the wafer surface.

5. The method of claim 4, further comprising:
repeating, for each the remaining plurality of probe structures, driving with a corresponding one of the piezoelectric driver units until each probe structure is determined to have made contact with the wafer surface; and
repeating, for each the remaining plurality of probe structures, performing the fine adjustment until each probe structure is determined to be in electrical contact with the wafer surface.

6. The method of claim 1, wherein the pressure sensing unit uses an optical detection technique to detect contact between the probe structure and the wafer surface, the optical detection technique including an optical detector array in proximity with the at least one probe structure, the optical detector array configured to receive an optical signal incident thereupon in response to an incident optical beam directed upon the surface of the probe structure.

7. The method of claim 1, wherein the pressure sensing unit uses an electrical detection technique to detect contact between the probe structure and the wafer surface, the electrical detection technique including a detector circuit and a moveable arm in proximity with the probe structure, the detector circuit configured to detect a change in at least one electrical circuit parameter based on the deflection of the probe structure.

8. The method of claim 1, wherein the pressure sensing unit uses a mechanical detection technique to detect contact between the probe structure and the wafer surface, the mechanical detection technique including a strain gauge and a moveable arm in proximity with the probe structure to detect a strain torsion associated with contact between the probe structure and the wafer surface.

9. The method of claim 1, wherein the at least one piezoelectric driver unit is a zonal piezoelectric driver unit.

10. The method of claim 9, further comprising control movement of a zone of the probe card assembly using the at least one a zonal piezoelectric driver unit such that individualized actuation of a given one of the at least one zone piezoelectric driver unit precisely adjusts a height of the probe structures associated with the zone.

11. The method of claim 10, further comprising individually actuating a given zonal piezoelectric driver unit will cause precision height adjustment of the at least one probe structure associated therewith.

12. A method of probing a wafer, the method comprising:
contacting a semiconductor wafer mounted on a motor driven wafer chuck using a plurality of individual probe structures, each probe structure configured with a pressure sensing unit integrated therewith, the probe card assembly including a plurality of zones, each zone including at least one respective probe structure;
determining feedback from the pressure sensing units of the individual probe structures; and
driving at least one probe structure of a first zone of the probe card assembly with at least one piezoelectric driver unit independently with respect to at least one probe structure of a second zone of the probe card assembly in response to the feedback, and driving the at least one probe structure of a respective zone based on contact between a surface of wafer and the at least one probe structure of a respective zone.

13. The method of claim 12, further comprising pivoting a second segment of the at least one probe structure to deflect away from a longitudinal axis of the at least one probe structure in response to contacting a probe tip of the second segment against a surface of the wafer.

14. The method of claim 13, further comprising detecting contact between the at least one probe structure and the wafer surface based on an optical detection technique.

15. The method of claim 14, further comprising detecting the contact between the at least one probe structure and the wafer in response to detecting an optical signal that is reflected from a surface of the at least one probe structure.

16. The method of claim 13, further comprising detecting contact between the at least one probe structure and the wafer surface based on an electrical detection technique to detect contact between the at least one respective probe structure and the wafer surface.

17. The method of claim 16, further comprising detecting at least one electrical condition in response to deflecting the at least one probe structure, and detecting the contact between the at least one probe structure and the wafer based on the at least one electrical condition.

18. The method of claim 17, wherein the electrical condition includes at least one of a short circuit condition, an open circuit condition, a change in capacitance, and a change in resistance, based on deflection of the at least one probe structure.

19. The method of claim 13, further comprising detecting contact between the at least one probe structure and the wafer surface based on a mechanical detection technique.

20. The method of claim 19, further comprising sensing torsion in response to deflecting the at least one probe structure, and detecting the contact between the at least one probe structure and the wafer surface based on the torsion.

* * * * *